(12) United States Patent
Wang et al.

(10) Patent No.: US 6,451,701 B1
(45) Date of Patent: Sep. 17, 2002

(54) METHOD FOR MAKING LOW-RESISTANCE SILICIDE CONTACTS BETWEEN CLOSELY SPACED ELECTRICALLY CONDUCTING LINES FOR FIELD EFFECT TRANSISTORS

(75) Inventors: Mei-Yun Wang; Shwangming Jeng; Shau-Lin Shue, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/993,068

(22) Filed: Nov. 14, 2001

(51) Int. Cl.[7] ............... H01L 21/425; H01L 21/44; H01L 21/302; H01L 21/406; H01L 21/26
(52) U.S. Cl. ............... 438/705; 438/528; 438/682; 438/655; 438/798
(58) Field of Search ............... 431/682, 510, 431/527, 528, 597, 683, 655, 705, 798

(56) References Cited

U.S. PATENT DOCUMENTS

| | | | |
|---|---|---|---|
| 4,800,170 A | * 1/1989 | Jain et al. | 438/423 |
| 4,992,137 A | * 2/1991 | Cathey et al. | 204/192.37 |
| 5,607,884 A | 3/1997 | Byan | 437/41 |
| 5,641,380 A | * 6/1997 | Yamazaki et al. | 438/164 |
| 5,656,546 A | 8/1997 | Chen et al. | 438/586 |
| 5,731,239 A | 3/1998 | Wong et al. | 438/296 |
| 5,863,820 A | 1/1999 | Huang | 438/241 |
| 5,866,451 A | 2/1999 | Yoo et al. | 438/241 |
| 5,869,359 A | 2/1999 | Prabhakar | 438/149 |
| 6,025,273 A | * 2/2000 | Chen et al. | 438/706 |
| 6,030,898 A | * 2/2000 | Liu | 204/192.37 |

* cited by examiner

Primary Examiner—Richard Elms
Assistant Examiner—Adam Pyonin
(74) Attorney, Agent, or Firm—George O. Saile; Stephen B. Ackerman

(57) ABSTRACT

A method for making reliable low-resistance contacts between closely spaced FET gate electrodes having high-aspect-ratio spacings. Polysilicon gate electrodes are formed. A conformal insulating layer is deposited and anisotropically etched back to form sidewall spacers on the gate electrodes. During conventional etch-back, the etch rate of the insulating layer between the closely spaced gate electrodes is slower resulting in a residual oxide that prevents the formation of reliable low-resistance contacts. This residual oxide requires an overetch in a hydrofluoric acid solution prior to forming silicide contacts. The wet overetch results in device degradation. A nitrogen or germanium implant is used to amorphize the oxide and to increase the wet etch rate of the residual oxide. Using this amorphization the wet etch that is commonly used as a pre-clean prior to forming silicide contacts can be used to remove the residual silicon oxide without overetching. The implant also results in a smoother interface between the silicide and the silicon substrate, which results in lower sheet resistance.

19 Claims, 3 Drawing Sheets

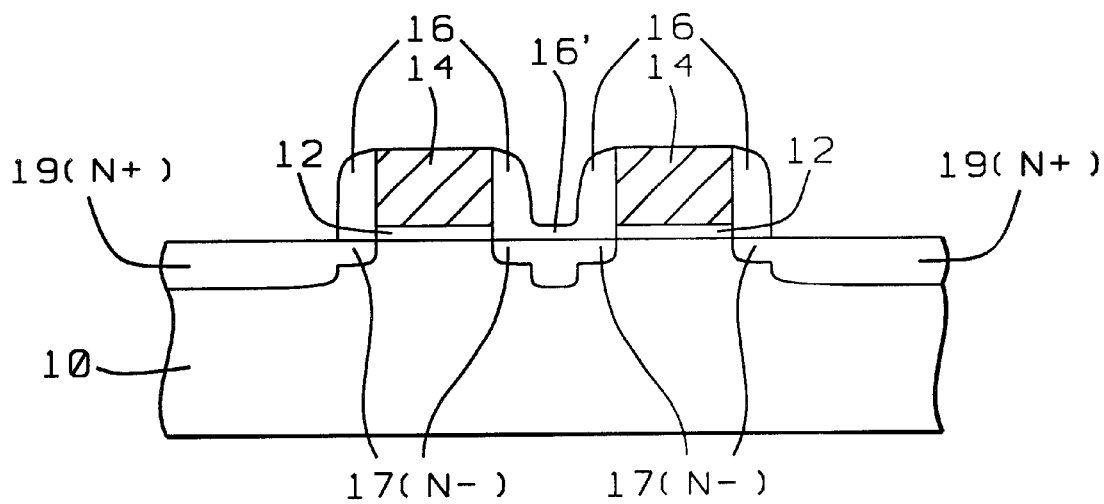
FIG. 1 – Prior Art
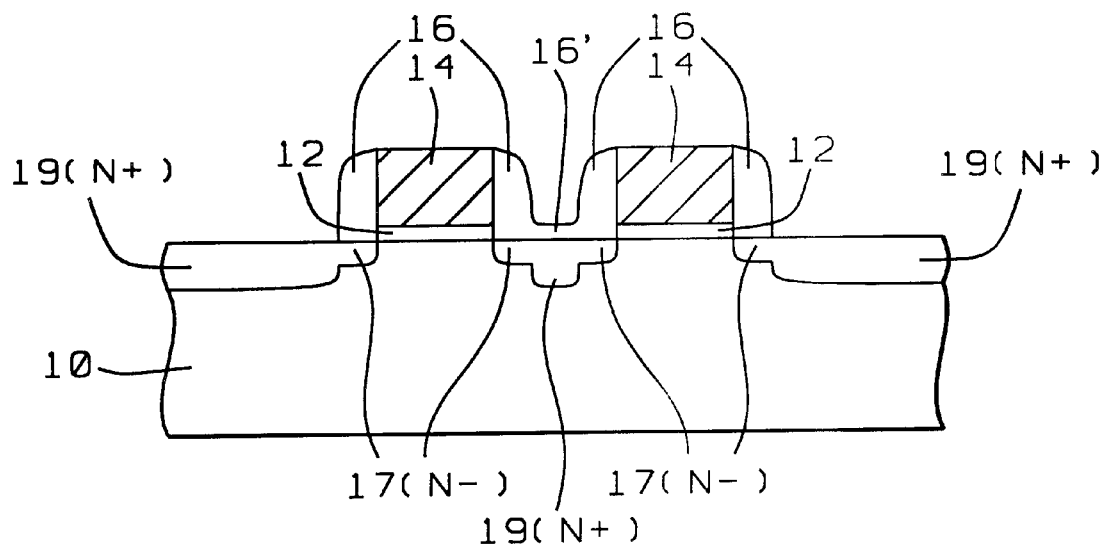
FIG. 2

METHOD FOR MAKING LOW-RESISTANCE SILICIDE CONTACTS BETWEEN CLOSELY SPACED ELECTRICALLY CONDUCTING LINES FOR FIELD EFFECT TRANSISTORS

BACKGROUND OF THE INVENTIONS (1) Field of the Invention

The present invention relates to the fabrication of integrated circuit devices on semiconductor substrates, and more particularly relates to a method for making reliable low-resistance silicide contacts between closely spaced patterned conducting stripes, hereafter also referred to as conducting lines. The method is particularly applicable for making more reliable silicide (source/drain) contacts between closely spaced sub-quarter-micrometer polysilicon gate electrodes (=or<0.25 um) for FETs. An ion implantation is used to amorphize any remaining residual silicon oxide ($SiO_2$) between the polysilicon gate electrodes during formation of sidewall spacers. The amorphized oxide is then more rapidly removed in a wet etch, avoiding overetching that would cause device degradation.

(2) Description of the Prior Art

Advances in the semiconductor process technologies in recent years have dramatically decreased the device feature sizes and increased the circuit density on integrated circuit chips. Current circuit densities require conducting lines having sub-quarter-micrometer widths (<0.25 um) with spacings that can be 0.35 um or less in width. One structure where these narrow spacings can occur is between the closely spaced polysilicon gate electrodes used to make the field effect transistors (FETS) with sub-quarter-micrometer channel lengths for Ultra Large Scale Integration (ULSI) circuits.

The conventional PETs are typically fabricated by patterning polysilicon gate electrodes over a thin gate oxide over device areas on a single-crystal semiconductor substrate. The gate electrode structure is used as a diffusion or implant barrier mask to form self-aligned lightly doped source/drain areas in the substrate adjacent to the sides of the gate electrodes. Next a conformal insulating layer is deposited and anisotropically etched back to form insulating sidewall spacers on the sides of the gate electrodes. Heavily doped source/drain contact areas are formed next to the sidewall spacers to complete the FET.

Unfortunately, when the conformal insulating layer, typically $SiO_2$, is etched back, the plasma etch rate is slower between the closely spaced gate electrodes, which makes it difficult to form reliable low-resistance ohmic contacts to the source/drain contact areas. The slower etch rate is believed to be a result of the depletion of the etchant gas in the high-aspect-ratio spaces between the gate electrodes. This etching problem is best understood by referring to the prior art FIG. 1. As shown in FIG. 1, the gate oxide 12 is formed on the substrate 10 and a poly-silicon layer 14 is deposited and patterned to form the closely spaced gate electrodes, also labeled 14. Lightly doped source/drain areas 17(N–) are formed adjacent to the gate electrodes. A conformal insulating layer 16 is deposited and anisotropically plasma etched back to form the sidewall spacers 16 on the gate electrodes. However, during the plasma etching, the slower etch rate results in residual portions 16' of the insulating layer 16 remaining between the closely spaced gate electrodes. The heavily doped source/drain contact areas 19(N+) are formed next by implanting a dopant. However, this oxide residue 16' makes it difficult to form good ohmic contacts to the source/drain contact areas 19(N+). Typically the residual oxide 16' is removed by using an extended wet etch in a hydrofluoric (HF) acid solution, which can result in higher leakage currents and degrade the device characteristics.

Several methods for making FET gate electrodes have been described in the literature. For example, in U.S. Pat. No. 5,731,239 to Wong et al. a method is described for making low-sheet-resistance gate electrodes by amorphization using ion implantation, while avoiding implant damage in the source/drain areas. In U.S. Pat. No. 5,656,546 to Chen et al. a method is described for implanting nitrogen into titanium silicide contacts to reduce the sheet resistance, U.S. Pat. No. 5,869,359 to Prabhakar describes a method for making FETs with raised source/drain areas on a silicon-on-insulator structure. Byun in U.S. Pat. No. 5,607,884 describes a method for making FETs with source/drain regions having shallow diffused junctions with thin silicide contacts. U.S. Pat. No. 5,866,451 to Yoo et al. describes a method for making semiconductor devices having 4T static RAMS and mixed-mode capacitors in logic, but the invention does not address the residual silicon oxide between closely spaced gate electrodes. Huang in U.S. Pat. No. 5,863,820 describes a method for making salicide contacts and self-aligned contacts on the same chip. However, none of the above references addresses the problems associated with residual silicon oxide between closely spaced gate electrodes resulting from slower etching in high-aspect openings, as described above.

Therefore, there is still a strong need in the semiconductor industry for making reliable closely spaced sub-quarter-micrometer gate electrodes having low-resistance silicide contacts to the FET source/drain contact areas without requiring excessive HF wet etching that would otherwise degrade device performance.

SUMMARY OF THE INVENTION

It is therefore a principal object of this invention to form reliable low-resistance silicide contacts to a silicon substrate between closely spaced patterned electrically conducting lines having insulating sidewall spacers, and more particularly relates to forming low-resistance silicide contacts to source/drain contact areas between polysilicon FET gate electrodes.

Another object of this invention is to provide these more reliable low-resistance silicide contacts by ion implanting to amorphize the unwanted residual $SiO_2$ between the gate electrodes that remains after insulating sidewall spacers are formed, making the amorphized oxide easier to remove (more rapid removal) in a wet etch.

A further object of this invention is to amorphize the $SiO_2$ by using a low-energy ion implant of nitrogen or germanium, which damages or degrades the oxide and results in a higher etch rate, without increasing device leakage current.

Still another objective of this invention is to improve the silicide/silicon substrate interface and to amorphize the top surface of the polysilicon gate electrodes to reduce junction leakage current by making a smoother silicide/silicon substrate interface, and to reduce the sheet resistance of the polycide gate electrodes.

In accordance with the objects of this embodiment, a method is provided for making improved low-resistance silicide contacts between closely spaced electrically conducting lines by removing the residual oxide remaining after anisotropic plasma etching, as described in the prior art. The method is particularly useful for making silicide contacts to source/drain contact areas between closely spaced field effect transistor (YET) gate electrodes.

The method begins by providing a semiconductor substrate. The substrate is typically a conductively doped single-crystal silicon. The FETs are formed in device areas that are typically surrounded and electrically isolated by field oxide regions. A thermal oxide is formed on the device areas to provide a thin gate oxide for the PETs. A conducting layer, preferably a conductively doped polysilicon layer, is deposited on the substrate, and the polysilicon layer is then patterned by photoresist masking and anisotropic etching to form closely spaced gate electrodes on the device areas and to form electrically interconnecting lines over the field oxide. Lightly doped source/drain regions are formed adjacent to the gate electrodes by implanting ions, such as $As^{75}$. Insulating sidewall spacers are formed on the sidewalls of the gate electrodes by depositing a conformal insulating layer over the gate electrodes and anisotropically etching back the insulating layer. Unfortunately in the conventional plasma etching process, the etch rate is slower between closely spaced lines because of the depletion effect of the etchant gas. This slower etch rate results in residual $SiO_2$ that makes it difficult to form good low-resistance ohmic silicide contacts for the FETs. Next, heavily doped source/drain contact areas are formed adjacent to the sidewall spacers by implanting a dopant.

A key feature of the invention is to perform an additional ion implant to amorphize the residual $SiO_2$. For example, the $SiO_2$ can be implanted with nitrogen or germanium ions to damage or degrade the residual oxide and to increase the wet etch rate. A wet etching is used to completely remove the residual $SiO_2$, which has a higher etch rate, without overetching other portions of the $SiO_2$ sidewall spacers. Silicide contacts are now formed by depositing a metal layer, such as cobalt (Co), titanium (Ti), or nickel (Ni). The metal layer is annealed to form silicide contacts on the source/drain areas of the substrate between the closely spaced polysilicon gate electrodes. The annealing also forms a silicide on the top surface of the exposed polysilicon gate electrodes. The unreacted portions of the metal over the $SiO_2$ surfaces are completely removed by etching. This result in self-aligned silicide (salicide) FET structures having good silicide contacts. The ion implant to amorphize the $SiO_2$ carried out prior to forming the silicide also modifies the top surface of the substrate to provide a smoother silicide/silicon substrate interface, which further reduces junction leakage current. The amorphizing implant also modifies the top surface of the polysilicon gate electrodes, which reduces the sheet resistance when the silicide is formed on the gate electrodes.

BRIEF DESCRIPTION OF THE DRAWINGS

The objects and other advantages of the invention will become more apparent in the preferred embodiment when read in conjunction with the following drawings.

FIG. 1 shows a schematic cross-sectional view of two closely spaced T gate electrodes of the prior art depicting the unwanted residual silicon oxide between the gate electrodes.

FIGS. 2 through 4 show schematic cross-sectional views of two FET gate electrodes showing the sequence of processing steps for eliminating the residual silicon oxide between the closely spaced gate electrodes using the amorphization process of the residual $SiO_2$.

DESCRIPTION OF THE PREFERRED EMBODIMENT

Figure 3:
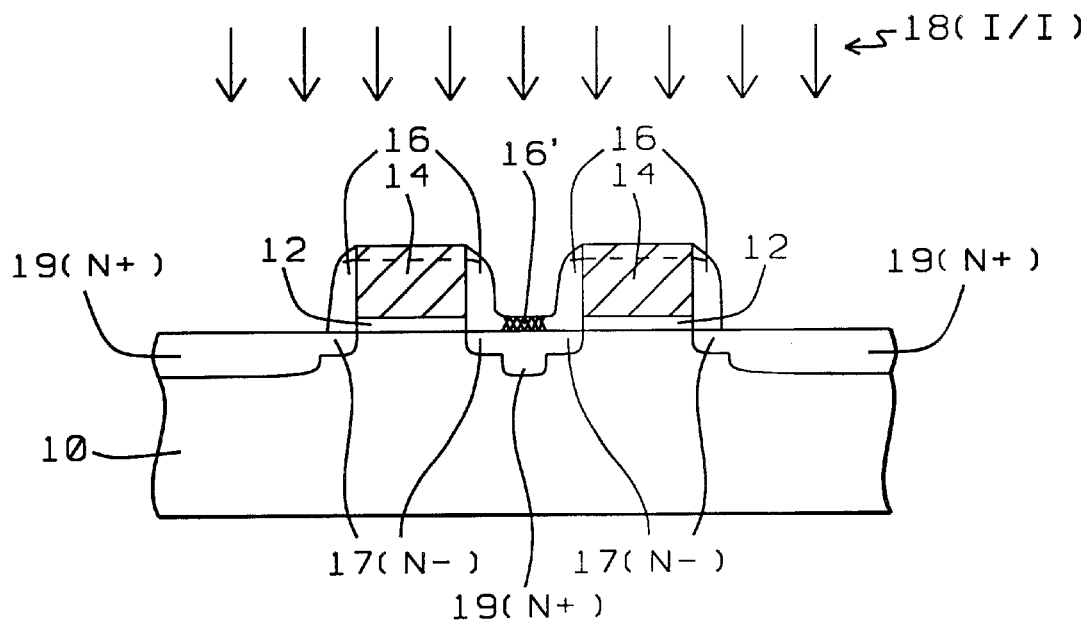

In keeping with the objects of this invention, the method for forming these reliable low-resistance silicide contacts between closely spaced conducting lines is now described in detail. The method is particularly useful for making closely spaced gate electrodes for FETs, but is also applicable in general for making contacts between closely spaced electrically conducting lines. Further, the method is described for closely spaced gate electrodes for N-channel FETs, but it should be well understood by one skilled in the art that the method for making these contacts can be applied to P-channel FETs by appropriately changing the electrical polarity of the dopant, and that contacts for both P- and N-channel FETs can be made on the same substrate (chip) for complementary metal oxide semiconductor (CMOS) circuits.

Referring now to FIG. 2, a schematic cross-sectional view is shown of a substrate 10 on which are formed two closely spaced PET gate electrodes on a device area. The preferred substrate 10 is composed of a P-type single-crystal silicon having a <100> crystallographic orientation. A field oxide isolation is typically used to electrically isolate the device areas, but is not shown to simplify the drawings and the discussion. A gate oxide 12 is formed on the device areas by thermal oxidation in an oxidation furnace using dry oxygen. The preferred thickness of the gate oxide 12 is between about 10 and 50 Angstroms. A polysilicon layer 14 is deposited by low-pressure chemical vapor deposition (LPCVD) using, for example, silane ($SiH_4$) as the reactant gas. The polysilicon layer 14 is deposited to a preferred thickness of between about 1000 and 2000 Angstroms, and is doped with an N type dopant such as arsenic or phosphorus to a concentration of between about 1.0 E 14 and 1.0 E 15 atoms/$cm^3$. Conventional photolithographic techniques and anisotropic plasma etching are used to pattern the polysilicon layer 14 to form the closely spaced FET gate electrodes 14. For example, the polysilicon can be patterned using high-density-plasma (HDP) etching and an etchant gas mixture such as $Cl_2$, HBr and $O_2$. For ULSI high-density circuits the width of the gate electrodes 14 is typically less than 0.25 micrometers (um), and the minimum spacing between gate electrodes is typically about 0.1 to 0.3 um.

Still referring to FIG. 2, lightly doped source/drain regions 17(N−) are formed adjacent to the gate electrodes 14 by using ion implantation of an N-type dopant species, such as arsenic ($As^{75}$) or phosphorus ($p^{31}$). A typical lightly doped source/drain region can be formed by implanting phosphorus ($P^{31}$) at a dose between about 1.0 E 13 and 1.0 E 14 atoms/$cm^2$ at an energy of between about 30 and 80 KeV.

Continuing with FIG. 2, after forming the lightly doped source/drain regions 17(N−), insulating sidewall spacers 16 are formed on the sidewalls of the gate electrodes 14. These sidewall spacers 16 are formed by depositing a conformal insulating layer, preferably a low-temperature $SiO_2$ and anisotropically plasma etching back to the surface of the substrate 10. For example, the $SiO_2$ layer 16 can be formed by chemical vapor deposition (CVD) using tetraethoxysilane (TEOS) at a temperature in the range of between about 650 and 900° C. Layer 16 is deposited to a thickness of between about 1000 and 2500 Angstroms.

Still referring to FIG. 2, the conformal $SiO_2$ layer 16 is anisotropically plasma etched back to the substrate surface 10 to form sidewall spacers 16 on the gate electrodes 14. The plasma etching is typically carried out in a HOP etcher or in a reactive ion etcher (RIE) using an etchant gas such as $CF_4$. After etching the $SiO_2$, the sidewall spacers 16 typically have a width of between about 400 and 1000 Angstroms. This results in a final spacing between the gate electrodes of about 0.02 and 0.1 um. Next, heavily doped source/drain contact areas 19($N^+$) are formed adjacent to the sidewall spacers 16 by implanting an $N^+$ dopant, such as arsenic, to complete the source/drain areas. For example, arsenic ions ($As^{75}$) can be implanted to a concentration of between about 1.0 E 16 and 1.0 E 18 atoms/cm$^3$.

Unfortunately, because of the high aspect ratio (height/width) of the space between the gate electrodes and the nature of the etching (etchant gas depletion), the $SiO_2$ etches slower between the gate electrodes leaving a residual $SiO_2$, as depicted by the residual $SiO_2$ portion 16' in FIG. 2. The residual oxide 16' results in unreliable contacts to the substrate between the gate electrodes.

Referring to FIG. 3, a key feature of this invention is to implant ions at relatively low energy to amorphize or damage the residual $SiO_2$ 16'. The preferred ion implantation 18(I/I) is carried out using nitrogen ions at a preferred dose of between about 1.0 E 14 and 1.0 E 15 atoms/cm$^2$ using an implant energy of about 10 to 30 KeV. Alternatively, the residual $SiO_2$ 16' can be implanted using germanium ions, also at a preferred dose of between about 1.0 E 14 and 1.0 E 15 atoms/cm$^2$ using an implant energy of about 10 to 30 KeV. The ion implant 18(I/I) also amorphizes the silicon substrate surface 10 to provide a smoother surface at the silicon/silicide interface when a sulicide is formed. The amorphization of the $SiO_2$ 16' results in a higher etch rate, This higher etch rate makes it easier to remove the residual oxide 16' in a wet etch. The standard HF pre-clean can now be used to remove the amorphized $SiO_2$ 16' before forming the silicide, without overetching the sidewall spacers, without degrading device leakage current.

Figure 4:
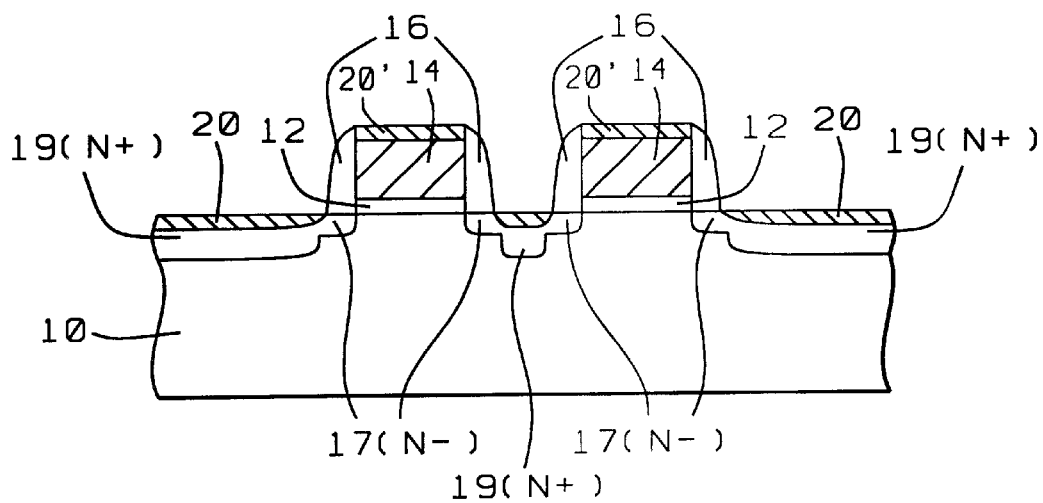

Referring now to FIG. 4, the amorphized residual oxide 16' is removed using a wet etch. The wet etch is carried out in a hydrofluoric (HF) acid/water etching solution having a ratio by volume of 1:100 of HF to $H_2O$ and for a time of about 60 seconds. The UP acid etch is carried out just prior to depositing the metals for forming the silicides. The normal HF pre-clean etching prior to depositing the metal is sufficient to remove the residual oxide 16' without any additional etching time. The overetching that would be required in the conventional process to remove the residual oxide is not necessary and therefore there is no degradation of device performance.

Referring still to FIG. 4, silicide contacts are formed by depositing a metal layer and annealing to form silicide contacts 20 on the source/drain contact areas 19($N^+$). Concurrently the annealing also forms a silicide layer 20' on the exposed top surface of the polysilicon gate electrodes 14 to provide a self-aligned salicide structure. A metal, such as cobalt (Co), titanium (Ti), or nickel (Ni) can be used to form the silicide. To form the titanium silicide, a blanket Ti layer is deposited. For example, the Ti layer can be deposited by physical sputtering from a Ti target to a thickness of between about 100 and 300 Angstroms The substrate is then annealed to form titanium silicide contacts on the $N^+$ doped source/drain contact areas 19($N^+$). A first rapid thermal anneal (RTA) in nitrogen ($N_2$) or argon (Ar) is carried out at a temperature of between about 500 and 800° C. to for a time of about 10 to 60 seconds to form the titanium silicide ($TiSi_2$). The unreacted Ti on the insulated surfaces of the substrate is then removed in a wet etch, such as in deionized water (DI $H_2O$), 30% hydrogen peroxide ($H_2O_2$), and ammonium hydroxide ($NH_4OH$). A second RTA is carried out at a temperature of between about 800 and 1000° C. for between about 10 and 60 seconds to complete the $TiSi_2$ phase of the reaction and thereby lowering the $TiSi_2$ sheet resistance. Cobalt silicide or nickel silicide contacts can be formed in a similar fashion as the $TiSi_2$. For Co the film thickness is between about 50 and 200 Angstroms. The first RTA is carried out at a temperature of between about 400 and 700° C. for a time of about 10 to 60 seconds. The unreacted Co is then removed in a solution of hydrochloric acid (HCl) and hydrogen peroxide ($H_2O_2$) at room temperature. A second RTA is carried out at a temperature of between about 650 and 900° C. for a time of about 10 to 60 seconds. For Ni the film thickness is between about 50 and 200 Angstroms. The RTA is carried out at a temperature of between about 300 and 700° C. for a time of about 10 to 60 seconds.

A further advantage of this invention is that the nitrogen or germanium ion implant used to amorphize the $SiO_2$ 16' also modifies the top surface of the substrate to provide a smoother silicide/silicon substrate interface, which further reduces junction leakage current.

EXAMPLE

Figure 5:
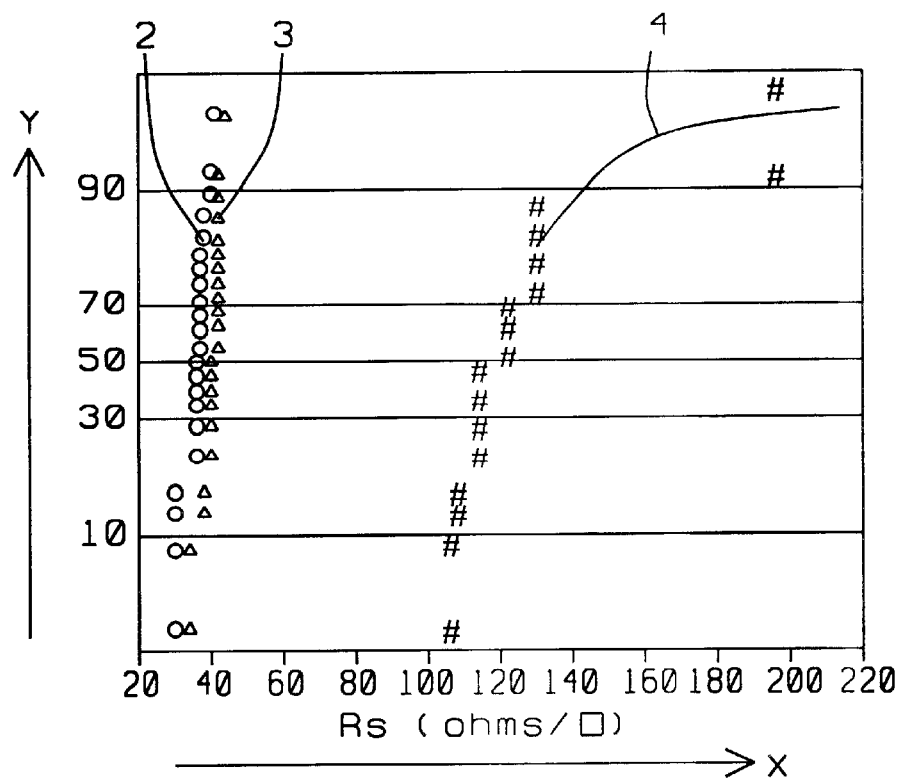
FIG. 5 shows a graph of the cumulative percent yield of test sites on the y axis vs. the contact resistance ($R_c$) along the x axis. The cumulative percent yield of test sites is plotted for the invention using nitrogen and germanium implants vs. the conventional process. Both the invention and the conventional process are for P doped contacts.

To better appreciate the advantages of this invention, FET structures were fabricated with closely spaced gate electrodes according to the description in the specification. The width of the gate electrodes was 0.25 um and the spacings, after forming the sidewall spacers, were 0.1 um. The sheet resistance ($R_s$) in ohms/square was measured between the closely spaced gate electrodes and the cumulative percent yield was measured as a function of the $R_s$. In FIG. 5 curve 2 is for P-channel FETs and for an amorphization implant with nitrogen (N) at a dose of 1.0 E 15 ions/cm$^2$ and an implant energy of 10 KeV, and an implant angle normal to the surface. In FIG. 5 the y axis is the cumulative percent yield, and the x axis is the $R_s$. Curve 3 is for an amorphization implant with germanium (Ge) at a dose of 3.0 E 14 ions/cm$^2$ and an implant energy of 20 KeV, and an implant angle of 7 degrees from the normal to the surface. The $R_s$ by the method of this invention varies by about 30 to 40 ohms/square. Curve 4 shows the results for the conventional process without amorphization. The sheet resistance for the conventional process varies by about 100 to 200 ohms/square, which is substantially higher.

Figure 6:
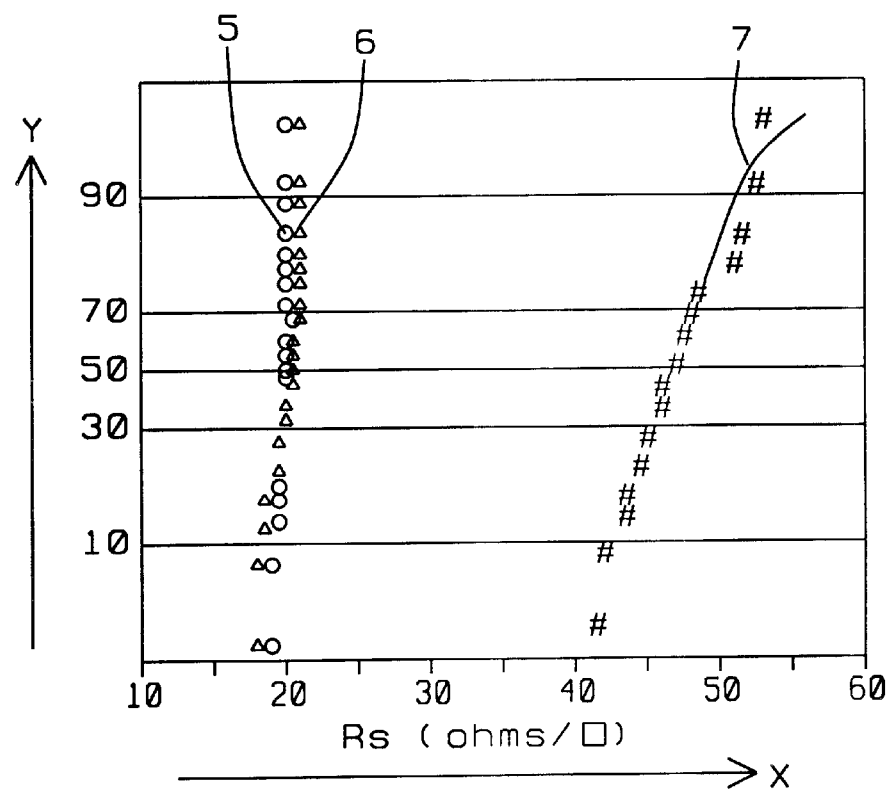
FIG. 6 shows a graph of the cumulative percent yield of test sites on the y axis vs. the $R_c$ along the x axis. The cumulative percent yield of test sites is plotted for the invention using nitrogen and germanium implants vs. the conventional process. Both the invention and the conventional process are for N doped contacts.

In FIG. 6, similar results are shown for an N-channel FET where curve 5 is for the nitrogen implant, curve 6 is for germanium implant, and curve 7 is for the conventional process. For the conventional process, $R_s$ varies from 40 to 50 ohms/square, and for the nitrogen- and germanium-implanted process the $R_s$ varies from about 17 to 20 ohms/square. The leakage currents for the nitrogen- and germanium-implanted process devices were generally lower or similar to the conventional process devices.

While the invention has been particularly shown and described with reference to the preferred embodiment thereof, it will be understood by those skilled in the art that various changes in form and details may be made without departing from the spirit and scope of the invention.

What is claimed is:

1. A method for forming reliable ohmic silicide contacts to a substrate between closely spaced electrically conducting lines having insulating sidewall spacers comprising the steps of:

providing a semiconductor substrate having device areas;

forming a gate oxide layer on said device areas;

depositing a conducting layer on said substrate;

patterning said conducting layer to form said closely spaced electrically conducting lines;

depositing a conformal silicon oxide insulating layer and anisotropically plasma etching to form sidewall spacers on said closely spaced conducting lines, wherein the etch rate of said plasma etching is inadvertently reduced between said closely spaced conducting lines resulting in an unwanted residual silicon oxide in spaces between said closely spaced conducting lines;

implanting ions in surface of said substrate thereby amorphizing said residual silicon oxide to increase the etch rate of said residual silicon oxide;

wet etching to completely remove said residual silicon oxide having said increased etch rate, and removing said gate oxide to said substrate, without overetching other portions of said silicon oxide of said sidewall spacers;

forming silicide contacts on said substrate adjacent to said sidewall spacers.

2. The method of claim 1, wherein said semiconductor substrate is single-crystal silicon.

3. The method of claim 1, wherein said conducting layer is polysilicon deposited to a thickness of between about 1000 and 2000 Angstroms and is patterned to form said conducting lines having widths of about 0.25 to 0.30 micrometers and spaces between said conducting lines of between about 0.1 and 0.3 micrometer.

4. The method of claim 1, wherein said conformal silicon oxide insulating layer is deposited to a thickness of between about 1000 and 2500 Angstroms.

5. The method of claim 1, wherein said residual silicon oxide is amorphized by implanting nitrogen ions at a dose of between about $1.0 E 14$ and $1.0 E 15$ ions/cm$^2$ and at an implant energy of about 10 to 30 KeV.

6. The method of claim 1, wherein said residual silicon oxide is amorphized by implanting germanium ions at a doze of between about $1.0 E 14$ and $1.0 E 15$ ions/cm$^2$ and at an implant energy of about 10 to 30 KeV.

7. The method of claim 1, wherein said wet etching is carried out in a hydrofluoric acid solution for a time sufficient to remove completely said amorphized silicon oxide.

8. The method of claim 1, wherein said suicide contacts are formed from a metal selected from the group that includes cobalt, titanium, and nickel.

9. A method for forming reliable ohmic silicide contacts to a substrate between closely spaced polysilicon FET gate electrodes having insulating sidewall spacers comprising the steps of:

providing a semiconductor substrate having device areas;

forming a gate oxide on said device areas;

depositing a polysilicon layer on said substrate;

patterning said polysilicon, layer to form said closely spaced polysilicon FET gate electrodes, and implanting ions to form lightly doped source/drain areas adjacent to said gate electrodes;

depositing a conformal silicon oxide insulating layer and anisotropically plasma etching to form sidewall spacers on said gate electrodes, wherein the etch rate of said plasma etching is inadvertently reduced between said polysilicon PET gate electrodes resulting in an unwanted residual silicon oxide in spaces between said polysilicon PET gate electrodes;

forming source/drain contact areas by ion implantation;

implanting ions in surface of said substrate thereby amorphizing said residual silicon oxide to increase the etch rate of said residual silicon oxide;

wet etching to completely remove said residual silicon oxide, which has a higher etch rate, without overetching other portions of said silicon oxide of said sidewall spacers;

depositing a metal layer and annealing to form silicide contacts on said substrate between said closely spaced patterned polysilicon gate electrodes and concurrently to form a silicide on said polysilicon gate electrodes;

removing unreacted portions of said metal to complete said reliable ohmic silicide contacts to said substrate between said closely spaced polysilicon FET gate electrodes, said polysilicon gate electrodes having a silicide surface to form self-aligned silicide PETs.

10. The method of claim 9, wherein said semiconductor substrate is single-crystal silicon.

11. The method of claim 9, wherein said polysilicon layer is deposited to a thickness of between about 1000 and 2000 Angstroms and is patterned to form said polysilicon gate electrodes having widths of about 0.25 to 0.30 micrometers, and spaces between said polysilicon gate electrodes of between about 0.1 and 0.3 micrometers.

12. The method of claim 9, wherein said conformal silicon oxide insulating layer is deposited by low-pressure chemical vapor deposition using a reactant gas of tetraethoxysilane and Oxygen.

13. The method of claim 9, wherein said conformal silicon oxide insulating layer is deposited to a thickness of between about 1000 and 2500 Angstroms.

14. The method of claim 9, wherein said residual silicon oxide is amorphized by implanting nitrogen ions at a dose of between about $1.0 E 14$ and $1.0 E 15$ ions/cm$^2$ and at an implant energy of about 10 to 30 KeV.

15. The method of claim 9, wherein said residual silicon oxide is amorphized by implanting germanium ions at a dose of between about $1.0 E 14$ and $1.0 E 15$ ions/cm$^2$ and at an implant energy of about 10 to 30 KeV.

16. The method of claim 9, wherein said wet etching is carried out in a hydrofluoric acid solution for a time sufficient to remove completely said amorphized silicon oxide.

17. The method of claim 9, wherein said metal layer is cobalt, and said annealing is carried out in a temperature range of between about 400 and 900° C. for a time of between about 10 and 60 seconds.

18. The method of claim 9, wherein said metal layer is titanium, and said annealing is carried out in a temperature range of between about 500 and 1000° C. for a time of between about 10 and 60 seconds.

19. The method of claim 9, wherein said metal layer is nickel, and said annealing is carried out in a temperature range of between about 300 and 700° C. for a time of between about 10 and 60 seconds.

* * * * *